Figure 3:
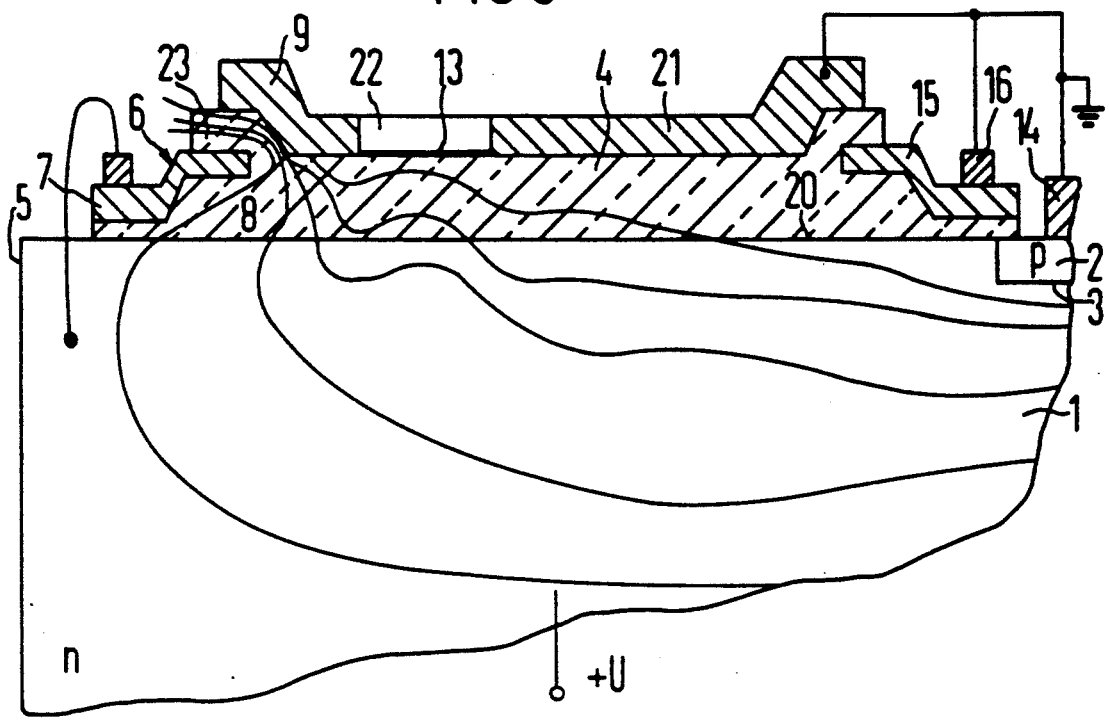

United States Patent [19]
Stengl et al.

[11] Patent Number: 5,311,052
[45] Date of Patent: * May 10, 1994

[54] PLANAR SEMICONDUCTOR COMPONENT WITH STEPPED CHANNEL STOPPER ELECTRODE

[75] Inventors: Jens P. Stengl; Helmut Strack; Jenö Tihanyi, all of München, Fed. Rep. of Germany

[73] Assignee: Siemens Aktiengesellschaft, Munich, Fed. Rep. of Germany

[*] Notice: The portion of the term of this patent subsequent to Jul. 10, 2006, has been disclaimed.

[21] Appl. No.: 426,783

[22] Filed: Sep. 29, 1982

[30] Foreign Application Priority Data

Oct. 16, 1981 [DE] Fed. Rep. of Germany ....... 3141203

[51] Int. Cl.$^5$ ............................. H01L 29/34
[52] U.S. Cl. ................... 257/488; 257/409; 257/630; 257/652; 257/659
[58] Field of Search ............ 357/23 HV, 23 VD, 34, 357/38, 52, 53, 65; 257/409, 488, 629, 630, 632, 659, 652

[56] References Cited

U.S. PATENT DOCUMENTS

| 3,602,782 | 8/1971 | Klein | 357/53 |
| 3,906,539 | 9/1975 | Sauermann et al. | 357/53 |
| 4,024,564 | 5/1977 | Shimada et al. | 357/53 |
| 4,074,293 | 2/1978 | Kravitz | 357/34 |
| 4,134,125 | 1/1979 | Adams et al. | 357/52 |

FOREIGN PATENT DOCUMENTS

| 656774 | 12/1964 | Belgium | 357/53 |
| 0037115 | 10/1981 | European Pat. Off. | 357/23 HV |
| 3046749 | 9/1981 | Fed. Rep. of Germany | 357/23 HV |
| 55-52272 | 4/1980 | Japan | 357/23 AV |

OTHER PUBLICATIONS

C. G. Jambotkar, "Spaced field plate for increasing planar junction breakdown voltage", *IBM Technical Disclosure Bulletin*, vol. 19 (1976) pp. 478-479.
Publication "Siemens Forschungs-und Entwicklungsberichten" (Siemens Research and Development Reports) vol. 9 (1980), No. 4, p. 186.

*Primary Examiner*—J. Carroll
*Attorney, Agent, or Firm*—Herbert L. Lerner; Laurence A. Greenberg

[57] ABSTRACT

Semiconductor component, including a semiconductor body having an edge, a surface, a substrate of a first given conductivity type, at least one zone being embedded in a planar manner in the substrate at the surface and being of a second conductivity type opposite the first given type, and insulating layer disposed on the surface, an electrode being in contact with the at least one zone, a channel stopper disposed on the insulating layer outside the at least one zone and in vicinity of the edge of the semiconductor body, the channel stopper being electrically connected to the substrate, and a field plate beind disposed on the insulating layer between the at least one zone and the channel stopper and being electrically connected to the at least one zone, the channel stopper being disposed at an increasing distance from the edge and the surface of the semiconductor body, as seen in direction toward the at least one zone.

2 Claims, 2 Drawing Sheets

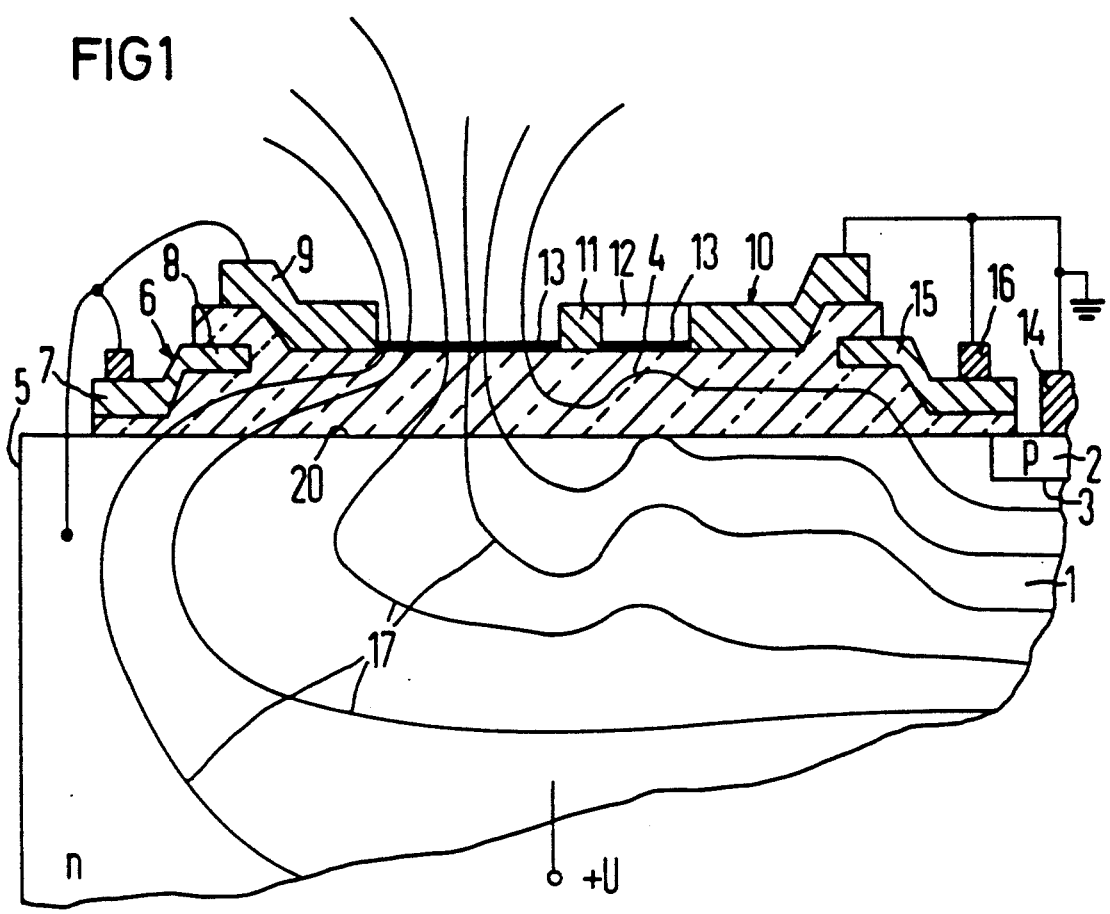
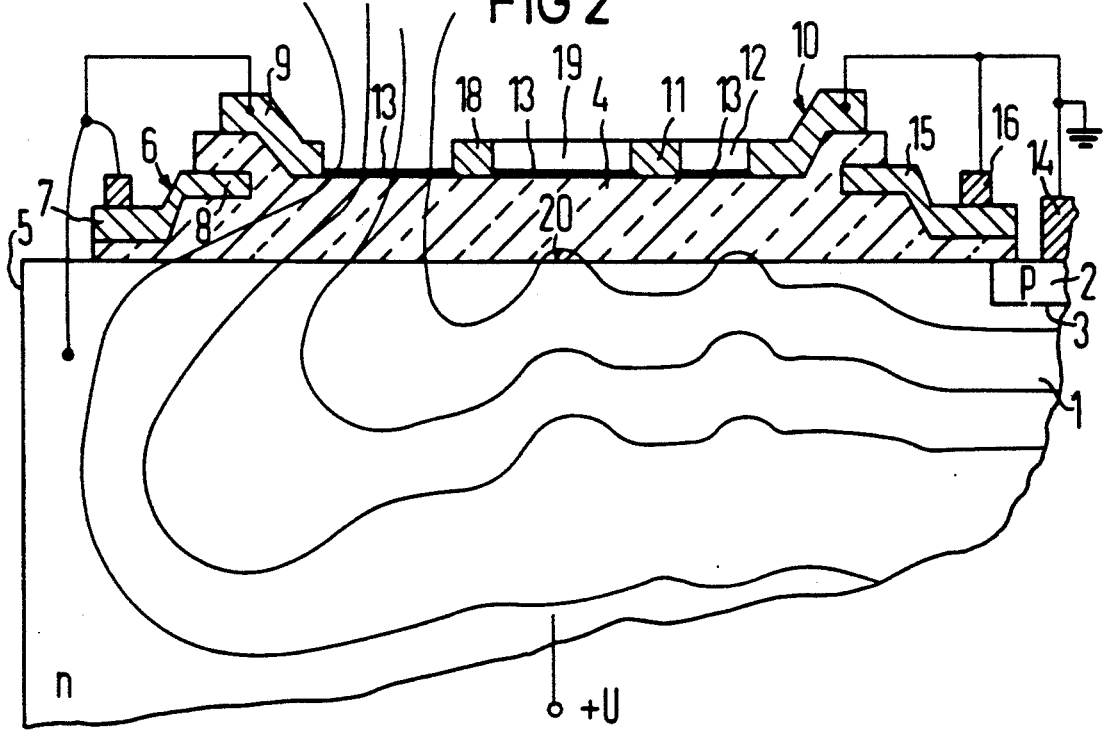

PLANAR SEMICONDUCTOR COMPONENT WITH STEPPED CHANNEL STOPPER ELECTRODE

The invention relates to a semiconductor component with a semi-conductor body, including a substrate of a first conductivity or conducion type and at least one zone of the opposite conduction type embedded in the substrate in a planar manner, an insulating layer disposed on the surface where the embedded zone is disposed, an electrode which is in contact with the zone, a channel stopper disposed on the insulating layer outside the zone on the edge of the semiconductor body, which is electrically connected to the substrate, and a field plate disposed on the insulating layer between the zone and the channel stopper, the field plate being electrically connected to the zone.

A semiconductor component of this type has already been described, for instance, in the publication "Siemens Forschungs-und Entwicklungs-berichten" (Siemens Research and Development Reports) volume 9 (1980), No. 4, page 186. In FIG. 13 of this publication, an MOS-power transistor with the afore-mentioned features is shown. The channel stopper which is situated on the edge of the transistor prevents a spreading out of the space charge zone up to the edge of the substrate. The equipotential lines run exclusively between the channel stopper and the field plate through the surface of the semiconductor body. The channel stopper is formed of an aluminum lead which is in contact with the substrate and also overlaps the insulating layer.

It has been observed that such a simple channel stopper causes a sharp curvature of the equipotential lines in the surface area of the semiconductor body. This brings with it a high field strength in the surface area of the semiconductor body which can result in a surface penetration. The breakdown voltage on the surface is less essential than in the semiconductor body. This problem exists not only with an MOS-power transistor, but in all planar semiconductor components.

It is accordingly an object of the invention to provide a planar semiconductor component, which overcomes the hereinafore-mentioned disadvantages of the heretofore-known devices of this general type, and to do so in such a manner that the strong curvature of the equipotential lines in the surface area of the semiconductor body is avoided.

With the foregoing and other objects in view there is provided, in accordance with the invention, a semiconductor component, including a semiconductor body having an edge, a surface, a substrate of a first given conduction or conductivity type, at least one zone being embedded in a planar manner in the substrate at the surface and being of a second conductivity type opposite the first given type, an insulating layer disposed on the surface, an electrode being in contact with the at least one zone, a channel stopper disposed on the insulating layer outside the at least one zone and in vicinity of or on the edge of the semiconductor body, the channel stopper being electrically connected to the substrate, and a field plate being disposed on the insulating layer between the at least one zone and the channel stopper and being electrically connected to the at least one zone, the channel stopper being disposed at an increasing distance from the edge and the surface of the semiconductor body, as seen in direction toward the at least one zone.

In accordance with another feature of the invention, the channel stopper has at least two steps, one of the steps being closer to the at least one zone and being further from the surface of the semiconductor body than the preceding step adjacent thereto.

In accordance with a further feature of the invention, the channel stopper is formed of a plurality of overlapping electrodes being electrically connected to each other.

In accordance with an added feature of the invention there is provided an at least one additional strip-shaped electrode disposed on the insulating layer between the field plate and the channel stopper, the additional strip-shaped electrode being electrically connected to the field plate.

In accordance with an additional feature of the invention there is provided a plurality of other strip-shaped electrodes irradiating or being disposed along the direction from the channel stopper toward the field plate at decreasing distances from each other.

In accordance with again another feature of the invention, the field plate is disposed at least at the same given minimum distance from the surface of the semiconductor body as the step of the channel stopper which is the highest or is furthest from the surface of the semiconductor body.

In accordance with again a further feature of the invention, the field plate overlaps the channel stopper.

In accordance with again an added feature of the invention, the field plate is a one-piece metal layer.

In accordance with again an additional feature of the invention, the field plate is formed of a plurality of metal layers disposed at the same level, and including cross pieces connecting the metal layers to each other.

Other features which are considered as characteristic for the invention are set forth in the appended claims.

Although the invention is illustrated and described herein as embodied in a planar semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIGS. 1–4 are fragmentary, diagrammatic cross-sectional views taken through one part of the semiconductor body and electrodes of four different embodiments.

Referring now to the figures of the drawing in which like parts are provided with the same reference symbols, and first particularly to FIG. 1 thereof, it is seen that the substrate of the semiconductor body is designated with reference numeral 1. In the substrate, a zone 2 with the opposite conduction or conductivity type as compared to the substrate, is embedded in a planar manner. The zone 2 and the substrate 1 border each other at a pn-junction 3. The surface of the semiconductor body is covered by an insulating layer 4 which usually is formed of silicon dioxide $SiO_2$. The insulating layer covers the pn-junction 3 on the surface of the semiconductor body and extends nearly to an edge 5 of the semiconductor body. A channel stopper 6 is provided on the edge 5, where the insulating layer 4 is located. The channel stopper is electrically connected with the substrate 1. The channel stopper is formed of two steps 7 and 8. The step 8 which is further from the edge 5 is disposed at a much greater distance from the surface 20 of the semiconductor body than the step 7 which is closer to the edge. The steps of the channel stopper may be formed solely of one doped polysilicon layer. Other conducting materials are also possible.

The channel stopper may also be formed of more than two steps; the third step will then be disposed at a greater distance from the surface 20 of the semiconductor body than the step 8. In the embodiment according to FIG. 1, the third step is in the form of a metal electrode 9, which overlaps the second step 8. The metal electrode 9 is also in contact with the substrate and forms a part of the channel stopper 6 therewith. Situated on the insulating layer 4 is a field plate 10, the purpose of which will be explained later. The field plate 10 is electrically connected through the electrode 14 with the zone 2.

When the voltage is applied with the polarity shown, the pn-junction 3 is biased in the cut-off direction. A free space charge zone is then formed, in which the equipotential lines are designated with reference numeral 17. Based on the fact that the distance from the channel stopper to the surface 20 increases toward the zone 2, the equipotential lines 17 will pass under the channel stopper with a larger radius of curvature. This means that the field strength inside the semiconductor body will be kept small. Furthermore, the equipotential lines will travel through the surface 20 of the semiconductor body at a greater distance from each other. This means that the surface field strength can remain small. Through suitable dimensioning it is possible for the penetration inside of the semiconductor body to approach the strength of the surface penetration.

The shape of the equipotential lines between the zone 2 and the channel stopper can be further improved through the field plate 10 which is mentioned above, and through an auxiliary electrode 15. The auxiliary electrode 15 is disposed at an increasing distance from the surface 20 in the direction toward the edge 5 of the semiconductor body and it overlaps the zone 2 with the part thereof which is situated closest to the surface 20. The auxiliary electrode is placed in contact with the electrode 14 and the field plate 10 through the electrode 16. The field plate 10 can be formed of several parts and can have a strip or ring-shaped electrode, which is electrically connected with the field plate through a cross piece 12. An electrode 11 shown in the drawing affects the form of the equipotential lines in such a manner that it also avoids the small curvature radius in the area under the field plate. The equipotential lines 17 extend out through the surface of the insulating layer 4. For passivation, the surface parts of the insulating layer 4 which are not covered by the electrodes are intended to have passivation layers 13, which, for example, can be formed of vaporized, amorhous silicon.

In the embodiment according to FIG. 1, the following dimensions may be provided:

The distance from the step 7 to the surface 20 of the semiconductor body may be 0.1 $\mu$m; the distance from the step 8 to the surface may be 0.5 to 1 $\mu$m; the minimum distance from the electrode 9 to the surface may be 1 to 2 $\mu$m; the distance from the electrode 9 to the strip-shaped electrode 11 may be 3 to 15 $\mu$m; the width of the electrode 11 may be 5 to 10 $\mu$m; the distance from the electrode 11 to the field plate 10 may be 20 to 50 $\mu$m, depending on the cut-off voltage; the spacing for the auxiliary electrode 15 corresponds to the channel stopper 6; the doping of the zone 2 may be $10^{18}$ to $10^{20}$ cm$^{-3}$; and the doping of the substrate 1 may be $2 \cdot 10^{14}$ cm$^{-3}$.

With such a semiconductor component it is possible to reach a cut-off or blocking voltage of 1000 volts, as opposed to a semiconductor component with a simple channel stopper, which only reaches a cut-off voltage of 700 volts.

The difference between the semiconductor components in FIGS. 1 and 2 is that several strip-shaped electrodes 11 and 18, belong to the fieldplate 10. The electrodes 11 and 18 are connected through cross pieces 13 and 19 with the fieldplate 10. Furthermore in this case because of the passage through the surface 20 of the semiconductor body, the result is large curvature radii and large spacings of the equipotential lines. The course of the equipotential lines under electrodes 11 and 18, as well as under the fieldplate 10 will be particularly favorable when the electrode 11 is disposed at a smaller distance from the fieldplate 10 than the distance from the electrode 18 to the electrode 11. The distance between electrode 11 and the electrode 18 can be between 20 and 50 $\mu$m and the distance between electrode 11 and fieldplate 10 can lie between 10 and 25 $\mu$m. All other sizes can be chosen to be equivalent to the embodiment according to FIG. 1.

Figure 4:
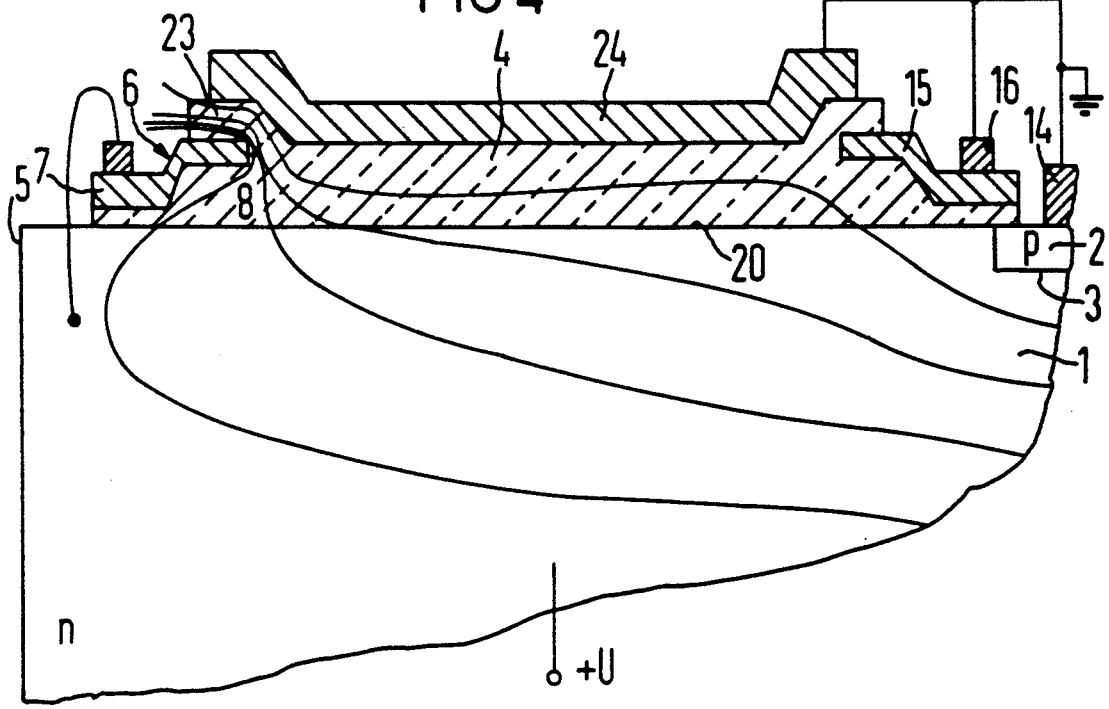

Especially stable recognizable lines are obtained in the semiconductor component according to FIG. 3, in which the insulating layer 4 is almost completely covered by the fieldplate, or in the semiconductor component according to FIG. 4, in which the insulating layer 4 is completely covered by the fieldplate. In the component according to FIG. 3, the uppermost step 9 of the channel stopper is connected by a cross piece 22 with fieldplate 21. Only the steps 7 and 8 of channel stopper 6 are at the substrate potential. This embodiment form is suitable for smaller cut-off voltages, since the equipotential lines are pressed together in a space 23 between the fieldplate and the upper step 8 of channel stopper 6. The material of insulating layer 4, for example, silicon dioxide, has indeed a much higher breakdown or avalanche voltage than silicon. However, the relatively slight distance between the fieldplate and the channel stopper limits the applicability of the cut-off or blocking voltage from 200 to 300 volts. The uncovered surface parts of insulating layer 4 by fieldplate 21 are covered again by the passivation layer 13 which can be of vapor deposited silicon. Very stable recognizable lines are possible in the embodiment example according to FIG. 4, because fieldplate 24 is overlapping channel stopper 6. Also, they press the field lines together in the space 23 between the fieldplate 24 and channel stopper 6. Therefore, the embodiment form is limited to a breakdown voltage of 200 to 300 volts.

The invention is suitable for all planar semiconductor components, such as thyristors, bipolar transistors, MOS-transistors and diodes. In semiconductor components with only one single system on the semiconductor chip, the channel stopper is situated around the system on the edge of the semiconductor body. In semiconductor chips with several systems, such as power-MOS-transistors and thyristors, the channel stopper is situated between the edge of the semiconductor chip and the edge of the neighboring systems.

The foregoing is a description corresponding to German Application P 31 41 203.3, dated Oct. 16, 1981, the International priority of which is being claimed for the instant application, and which is hereby made part of this application. Any discrepancies between the foregoing specification and the aforementioned corresponding German application are to be resolved in favor of the latter.

We claim:

1. Semiconductor component, comprising a semiconductor body having an edge, a surface, a substrate of a first given conductivity type, at least one zone being embedded in a planar manner in said substrate at said surface and being of a second conductivity type opposite said first given type, an insulating layer disposed on said surface, an electrode being in contact with said at least one zone, at least one channel stopper electrode disposed on said insulating layer outside said at least one zone and in vicinity of said edge of said semiconductor body and having at least one step, said channel stopper electrode being electrically connected to said substrate, and a field plate being disposed on said insulating layer between said at least one zone and said channel stopper electrode and being electrically connected to said at least one zone, said insulating layer having a surface, said field plate overlapping said channel stopper electrode and at least partially covering said surface of said insulating layer, said channel stopper electrode and said field plate defining a space therebetween, wherein said channel stopper electrode has at least two steps, one of said steps being closer to said at least one zone and being further from said surface of said semiconductor body than the step adjacent thereto, and wherein said channel stopper electrode is formed of a plurality of overlapping electrodes being electrically connected to each other.

2. Semiconductor component, comprising a semiconductor body having an edge, a surface, a substrate of a first given conductivity type, at least one zone being embedded in a planar manner in said substrate at said surface and being of a second conductivity type opposite said first given type, an insulating layer disposed on said surface, an electrode being in contact with said at least one zone, at least one channel stopper electrode disposed on said insulating layer outside said at least one zone and in vicinity of said edge of said semiconductor body and having at least one step, said channel stopper electrode being electrically connected to said substrate, and a field plate being disposed on said insulating layer between said at least one zone and said channel stopper electrode and being electrically connected to said at least one zone, said insulating layer having a surface, said field plate overlapping said channel stopper electrode and at least partially covering said surface of said insulating layer, said channel stopper electrode and said field plate defining a space therebetween, wherein said channel stopper electrode has at least two steps, one of said steps being closer to said at least one zone and being further from said surface of said semiconductor body than the step adjacent thereto, and wherein said field plate is disposed at least at the same given minimum distance from said surface of said semiconductor body as the step of said channel stopper electrode which is furthest from said surface of said semiconductor body.

* * * * *